(12) United States Patent
Nakamura et al.

(10) Patent No.: US 10,435,783 B2
(45) Date of Patent: Oct. 8, 2019

(54) TARGET ASSEMBLY

(71) Applicant: ULVAC, INC., Kanagawa (JP)

(72) Inventors: Shinya Nakamura, Kanagawa (JP);
Yoshihiro Ikeda, Kanagawa (JP);
Yuusuke Miyaguchi, Kanagawa (JP);
Kazuyoshi Hashimoto, Kanagawa (JP);
Kengo Tsutsumi, Kanagawa (JP);
Yoshinori Fujii, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 316 days.

(21) Appl. No.: 15/527,754

(22) PCT Filed: Jun. 16, 2015

(86) PCT No.: PCT/JP2015/003004
§ 371 (c)(1),
(2) Date: May 18, 2017

(87) PCT Pub. No.: WO2016/088284
PCT Pub. Date: Jun. 9, 2016

(65) Prior Publication Data
US 2017/0268097 A1    Sep. 21, 2017

(30) Foreign Application Priority Data

Dec. 3, 2014  (JP) ................ 2014-244802

(51) Int. Cl.
*H01J 37/34* (2006.01)
*C23C 14/34* (2006.01)
*C23C 14/08* (2006.01)

(52) U.S. Cl.
CPC ........ *C23C 14/3407* (2013.01); *C23C 14/081* (2013.01); *H01J 37/3491* (2013.01)

(58) Field of Classification Search
CPC ............... C23C 14/081; C23C 14/3407; H01J 37/3491; H01J 37/3447; H01J 37/3441
(Continued)

(56) References Cited

U.S. PATENT DOCUMENTS 6,689,254 B1 * 2/2004 Hurwitt ............... C23C 14/3407
204/192.12

FOREIGN PATENT DOCUMENTS

CN    102906302 A    1/2013
JP    57-194254 A    11/1982
(Continued)

OTHER PUBLICATIONS

Office Action from Chinese Patent App. No. 2015800659261 (dated Oct. 9, 2018).
(Continued)

*Primary Examiner* — Rodney G McDonald
(74) *Attorney, Agent, or Firm* — Cermak Nakajima & McGowan LLP; Tomoko Nakajima

(57) ABSTRACT

A target assembly is provided in which an abnormal discharging between a projected portion of a backing plate and a side surface of the target is prevented and also in which a bonding material to bond the target and the backing plate can be surely prevented from seeping to the outside and also which is easy in reusing the backing plate. The target assembly according to this invention having: a target made of an insulating material; and a backing plate bonded to one surface of the target via a bonding material, the backing plate having a projected portion which is projected outward beyond an outer peripheral edge of the target, further has an annular insulating plate. The annular insulating plate: encloses a circumference of the target while maintaining a predetermined clearance to a side surface of the target; and covers that surface of the projected portion.

5 Claims, 3 Drawing Sheets

(58) Field of Classification Search
USPC .................................... 204/298.11, 298.12
See application file for complete search history.

(56) References Cited

FOREIGN PATENT DOCUMENTS

| | | |
|---|---|---|
| JP | 60-197873 A | 10/1985 |
| JP | 11-504986 A | 5/1999 |
| JP | 2010-255052 A | 11/2010 |
| JP | 2013-129871 A | 7/2013 |
| TW | 332222 B | 5/1998 |
| TW | 200502416 A | 1/2005 |

OTHER PUBLICATIONS

Office Action from Taiwanese Patent App. No. 104122310 (dated Mar. 13, 2018).
International Search Report and Written Opinion for PCT Patent App. No. PCT/JP2015/003004 (dated Jul. 28, 2015) with English translation of ISR.

\* cited by examiner

TARGET ASSEMBLY

This application is a national phase entry under 35 U.S.C. § 371 of PCT Patent Application No. PCT/JP2015/003004, filed on Jun. 16, 2015, which claims priority under 35 U.S.C. § 119 to Japanese Patent Application No. 2014-244802, filed Dec. 3, 2014, both of which are incorporated by reference.

TECHNICAL FIELD

The present invention relates to a target assembly which is assembled into a sputtering apparatus and relates, in particular, to a target assembly comprising: a target made of an insulating material; and a backing plate bonded to one surface of the target via a bonding material. The backing plate has a projected portion which is projected outward beyond an outer peripheral edge of the target.

BACKGROUND ART

For example, in the processes of manufacturing a NAND flush memory or a MRAM (magneto-resistive random-access memory), processes of forming insulator films such as aluminum oxide films, magnesium oxide films, and the like are carried out. Sputtering apparatus is used in order to form insulator films with good productivity. In this kind of sputtering apparatus, inside a vacuum chamber that can be evacuated, there is detachably assembled a target assembly which is made by integrating a target that is appropriately selected depending on the composition of a thin film to be formed, and a backing plate for cooling the target at the time of film forming by sputtering.

This kind of target assembly is known, e.g., in Patent Document 1. According to this arrangement, the backing plate is formed of metal such as copper with good thermal conduction, and has a projected portion projected outward beyond an outer peripheral end of the target. By taking advantage of this projected portion, it is so arranged that the target assembly can be fixed to a predetermined position of the sputtering apparatus. Further, after having assembled the target assembly into the sputtering apparatus, an annular shield plate is generally disposed opposite to the projected portion, for the purpose of stabilizing the discharging, etc.

By the way, in a state in which the target assembly and the shield plate have been assembled into the sputtering apparatus, there is a clearance between the side surface of the target and the shield plate. When plasma is caused to be generated in the vacuum chamber at the time of film forming, the electrons in the plasma will sometimes be electrostatically charged, through the above-mentioned clearance, in the projected portion that is made of metal. When the projected portion gets charged with electrons, since the target is made of an insulating material, abnormal discharging occurs due to the potential difference between the side surface of the target and the projected portion. Due to this phenomenon, there is a case in which the bonding material gets seeped to the outside. If film forming is performed in this kind of state, there will occur so-called contamination in which metal gets mixed into the insulation film that is formed on the surface of a substrate. This will prevent good film formation.

In order to prevent the bonding material from seeping to the outside, the applicant of this patent application has once proposed a cathode assembly in a prior patent application (Japanese Patent Application No. 2014-163095). What the applicant proposed in the patent application was a cathode assembly: in which the bonding portion of the backing plate to which a target is bonded, is protruded relative to the projected portion; the surfaces are roughened from the projected portion to the side surface of the bonded portion; and the film of insulating material is formed to extend from the projected portion to the side surface of the target. In case the life time of the backing plate is longer than that of the target, the backing plate is reused. In other words, once a predetermined number of processed products has reached, the target assembly is taken out of the sputtering apparatus, the bonding material is removed to separate the used target from the backing plate, and an unused target is bonded to the backing plate by means of a bonding material. The target assembly obtained in this manner will be assembled in the sputtering apparatus.

In the above-mentioned cathode assembly of the above-mentioned prior patent application, before the bonding material is removed, the insulator film made of an insulating material must be removed. But the removal of this insulator film is very difficult. Further, after bonding the unused target to the backing plate, an insulator film must be formed once again. It takes much time in reusing the backing plate.

PRIOR ART DOCUMENT

Patent Document

Patent Document 1: JP-2010-255052 A

SUMMARY OF THE INVENTION

Problems that the Invention is to Solve

In view of the above points, this invention has a problem of providing a target assembly: which is capable of preventing abnormal discharging from taking place between the projected portion of the backing plate and the side surface of the target; which is also capable of surely preventing the bonding material that bonds the target and the backing plate together from seeping to the outside; and which is easy in reusing the backing plate.

Means of Solving the Problems

In order to solve the above problems, a target assembly according to this invention comprising: a target made of an insulating material; and a backing plate bonded to one surface of the target via a bonding material, the backing plate having a projected portion which is projected outward beyond an outer peripheral edge of the target has features in that the target assembly is further provided with an annular insulating plate: which encloses a circumference of the target while maintaining a predetermined clearance to a side surface of the target; which covers that surface of the projected portion which lies on a side of the target; and which is detachably attached to the backing plate.

According to this invention, that surface of the projected portion which lies on the side of the target is arranged to be covered by the annular insulating plate which encloses the circumference of the target, and that a predetermined clearance is present between the insulating plate and the side surface of the target. Therefore, the electrons in the plasma are prevented from getting electrostatically charged to the projected portion through the clearance, thereby restricting the occurrence of abnormal electric discharging. As a result, the bonding material that bonds the target and the backing plate together can surely be prevented from seeping to the outside. In addition, since the insulating plate is detachable at the time of replacement of the target, the insulating plate can be removed from the backing plate and the bonding material can be removed. Then, the used target and the backing plate can be easily separated. Unlike the above-mentioned prior patent application, the removal of, and formation once again of, the insulation film become unnecessary. Therefore, reusing of the backing plate is easy.

In this invention, in case an annular shield plate to enclose the circumference of the target is disposed while maintaining a predetermined clearance to the side surface of the target in a state in which the target assembly is assembled into the sputtering apparatus, the target assembly preferably has a protruded strip which protrudes toward the target in that inner peripheral portion of the insulating plate which faces a clearance between the target and the shield plate. It is to be noted here that, if the insulating plate is made thicker, the electrons in the plasma become harder to pass through the clearance between the side surface of the target and the insulating plate. As a consequence, while the margin of the clearance can be widened, the distance between the insulating plate and the shield plate becomes smaller. Abnormal discharging between the two, therefore, becomes likely to occur. According to this invention, on the other hand, since the thickness of the inner peripheral edge portion of the insulating plate can be made thicker, while the occurrence of abnormal discharging between the insulating plate and the shield plate is being prevented, the margin of the clearance between the side surface of the target and the insulating plate can advantageously be widened.

In this invention, preferably the insulating plate has a plurality of through-holes formed at a distance from one another in the circumferential direction, and is fixed to the backing plate via a spacer which is internally inserted into each of the through-holes while maintaining a clearance to an inner wall of each of the through-holes. Provided that side of the insulating plate which lies on the side of the backing plate is defined as an upper side, the spacer has formed at a lower end thereof a flange portion which extends radially outward, and an upper surface of the flange portion is in contact with a lower surface of the insulation plate. According to this arrangement, even if the target radially extends due to thermal expansion of the target in the radial direction with radiation heat from plasma, and consequently pushes the insulating plate, the insulating plate can radially move by the amount of the clearance to the inner wall of each of the through-holes. Cracking of the insulating plate can thus be prevented.

In this invention, preferably the insulating plate is divided into a plurality of arcuate members; each of the arcuate members has, at circumferential one end, a first stepped portion in which a lower part extends further than an upper part, and a second stepped portion in which the upper part extends further than the lower part; and stepped surfaces of the first stepped portion and the second stepped portion of the adjoining arcuate members are mutually brought into contact with each other. According to this arrangement, each of the arcuate members can be moved in the radial direction. Therefore, the clearance between the side surface of the target and the insulating plate can be substantially equally adjusted over the entire circumference.

MODES FOR CARRYING OUT THE INVENTION

With reference to the accompanying drawings, a description will be made of a target assembly according to an embodiment of this invention by referring to an example which is assembled into a sputtering apparatus. In the following description, the side of the ceiling portion of the vacuum chamber 1 is defined as "top or upper", and the bottom side thereof is defined as "bottom or lower" with FIG. 1 serving as a standard.

Figure 1:
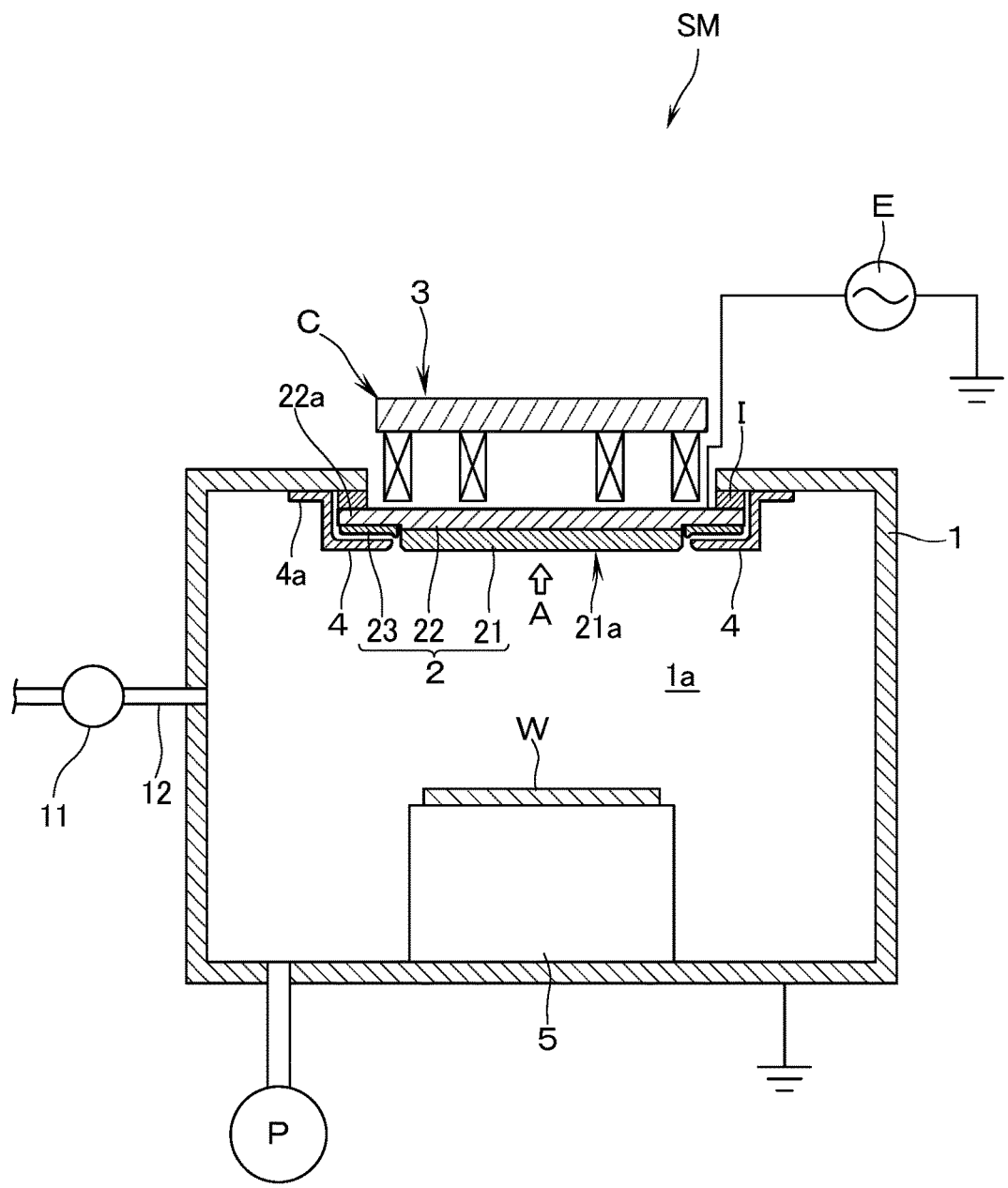
FIG. 1 is a schematic sectional view of a sputtering apparatus into which a target assembly according to an embodiment of this invention has been assembled.

As shown in FIG. 1, the sputtering apparatus SM is provided with a vacuum chamber 1 which defines a processing chamber 1a. To the bottom portion of the vacuum chamber 1, there is connected, through an exhaust pipe, a vacuum pump P which is made up of a turbo molecular pump, a rotary pump, and the like. It is thus so arranged that the vacuum chamber 1 can be evacuated to a predetermined pressure (e.g., $1\times10^{-5}$ Pa). To the side wall of the vacuum chamber 1, there is connected a gas pipe 12 which is communicated with a gas source (not illustrated) and which has interposed therein a mass flow controller 11. It is thus so arranged that a sputtering gas made up of a rare gas such as Ar can be introduced into the processing chamber 1a at a predetermined flow rate.

Figure 2:
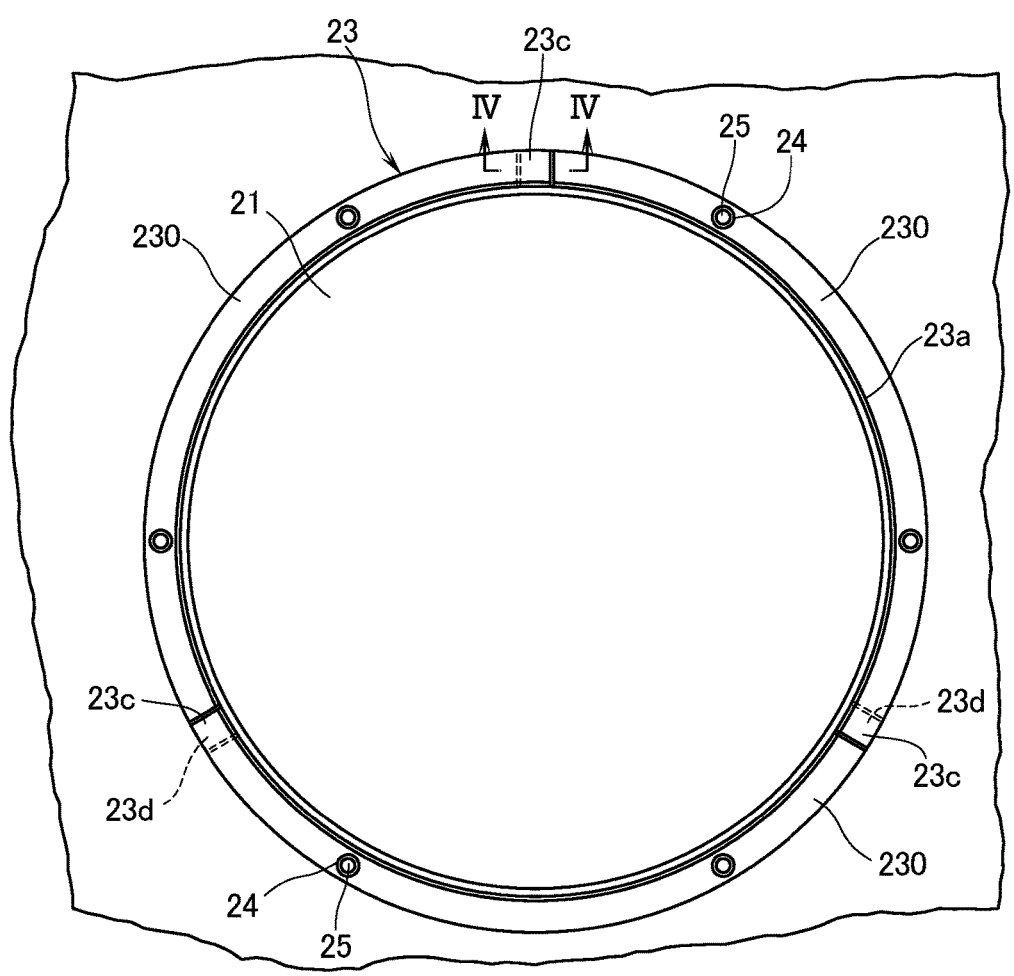
FIG. 2 is a view of the target assembly as seen in the direction of an arrow "A" shown in FIG. 1.
Figure 3:
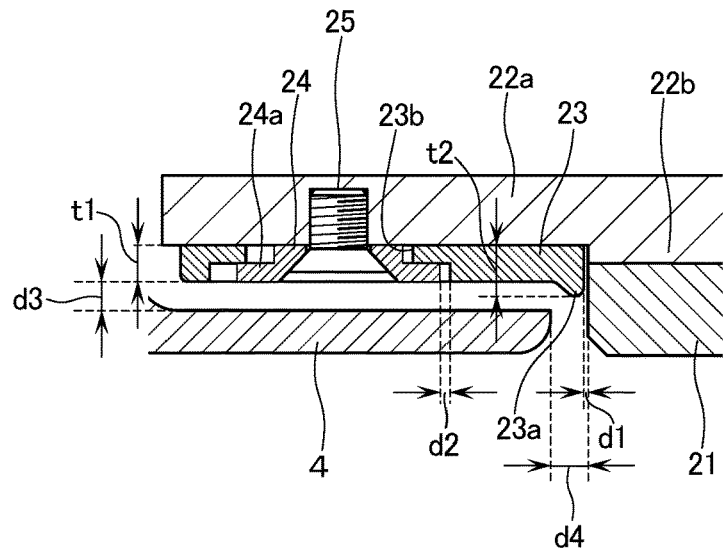
FIG. 3 is a sectional view showing in enlargement essential portion of the target assembly.

At the ceiling portion of the vacuum chamber 1, there is disposed a cathode unit C. The cathode unit C is constituted by a target assembly 2 and a magnet unit 3. With reference also to FIGS. 2 and 3, the target assembly 2 is made up by integrating: a target 21 made of an insulating material which is appropriately selected depending on the composition of the thin film to be formed; and that backing plate 22 made of a metallic material which is to cool the target 21 at the time of film forming by sputtering. The target 21 and the backing plate 22 are bonded together via a bonding material (not illustrated) such as indium, tin and the like. The target 21 has connected thereto an output from a HF power source having a known construction as a sputtering power source E and, during sputtering, AC power is applied. The magnet unit 3 has a known construction in which: a magnetic field is generated in a space below the sputtering surface 21a of the target 21; the electrons and the like that are ionized below the sputtering surface 21a at the time of sputtering are captured; and the sputtered particles scattered from the target 21 are efficiently ionized.

The backing plate 22 has a projected portion 22a which is projected outward and horizontally beyond an outer peripheral end of the target 21. This projected portion 22a is fixed, through an insulating material I, to the vacuum chamber 1. According to this arrangement, the target assembly 2 is assembled into the sputtering apparatus SM and, in this state, the annular shield plate 4 is disposed to lie opposite to the projected portion 22a. At an upper end of the side wall portion that is erected upward from the outer peripheral portion of the shield plate 4, there is provided a flange portion 4a. As a result of fixing this flange portion 4a to the inside surface of the upper wall of the vacuum chamber 1, the shield plate 4 can be made to be of grounding potential.

Alternatively, the shield plate 4 may be made to be floating. By the way, that bonding portion 22b of the backing plate 22 to which is bonded the target 21 is protruded downward relative to the projected portion 22a. The amount of protrusion, i.e., the length from the lower surface of the bonding portion 22b to the lower surface of the projected portion 22a is adjusted to fall within a range of 0.5~10 mm.

By the way, for the purpose of stabilizing the electrical discharging, and the like purposes, there is ordinarily provided a clearance d4 of, e.g., 0.5 mm~2 mm between the shield plate 4 and the target 21. Once the plasma passed through this clearance to thereby reach the projected portion 22a of the backing plate 22, due to AC voltage applied to the projected portion 22a, electric current flows to the plasma, and abnormal electric discharging occurs.

As a solution, the target assembly 2 according to this embodiment is further provided with an annular insulating plate 23 which: encloses the circumference of the target 21 at a predetermined clearance d1 to a side surface of the target 21; covers that surface of the projected portion 22a which lies on the side of the target 21; and is detachable to the backing plate 22. The insulating plate 23 may be manufactured of an insulating material such as aluminum oxide and the like. The thickness t1 of the insulating plate can be set, in case the thickness of the target 21 is set to an ordinary range within 2 mm~16 mm, to a range in which the lower surface of the insulating plate 23 is not positioned below the front face (lower surface) of the target 21, e.g., to a range of 1 mm~15 mm. However, as shown in FIG. 3, in case the surface of installing (i.e., the lower surface of the projected portion 22a) the insulating plate 23 in the backing plate 22 is positioned above the surface of bonding of the target 21 and the backing plate 22, within a limit in which the lower surface of the insulating plate 23 is not positioned below the surface of the target 21, the plate thickness t1 can be set above 15 mm. The insulating plate 23 has a protruded strip 23a which is protruded toward the target at that inner peripheral portion of the insulating plate 23 which faces a clearance between the target 21 and the shield plate 4. The thickness t2 at the inner peripheral portion of the insulating plate 23 inclusive of the protruded strip 23a may be set, e.g., to a range of 1.5 mm~15.5 mm. In particular, in case the thickness of the target 21 is relatively thin, the creeping distance from the backing plate 22 to the space in which the plasma is present cannot be secured. Therefore, the effect of providing the protruded strip 23a becomes high. In addition, if the clearance d4 between the shield plate 4 and the target 21 can be widened, the protruded strip 23a can be formed large (high). However, by disposing the shield plate 4 in the ground potential, the plasma shielding effect will be lost. As a consequence, the plasma density becomes high in the neighborhood of the insulating plate 23 and the target 21, the protruded strip 23a will be sputtered in the same manner as the target 21, thereby giving rise to the cause for contamination. In view of the above, the heights of the clearance d4 and the protruded strip 23a shall preferably be kept within a range not to be sputtered. The clearance d4 shall preferably be set, e.g., to a range of 0.5 mm~6 mm, more preferably be set to a range of 0.5 mm~3.5 mm, and most preferably be set to the range of 1.5 mm~3.5 mm. Further, the front end (lower end) of the protruded strip 23a shall preferably be positioned above the lower surface of the shield plate 4, more preferably be positioned between the upper surface and the lower surface of the shield plate 4, and preferably be positioned above the upper surface of the shield plate 4.

The insulating plate 23 has a plurality (six pieces in FIG. 2) of through-holes through-hole at a distance from one another in the circumferential direction. A spacer 24 is inserted into an inner side of each of the through-hole 23b while keeping a circumferential clearance d2 to an inner wall of each of the through-hole 23b. The insulating plate 23 is fixed to the backing plate 22 by means of the spacer 24 with screws 25. According to this arrangement, the insulating plate 23 can be moved in the radial direction by an amount of this clearance d2. Therefore, even if the target 21 may have extended in the radial direction due to the radiation heat from the plasma, the insulating plate 23 can be prevented from getting cracked. Further, the spacer 24 has, at the lower end portion, a flange portion 24a which extends in the radially outward. By causing the upper surface of this flange portion 24a to be brought into contact with the lower surface of the insulating plate 23, the insulating plate 23 is pushed against the backing plate 22 and also the backing plate 22 is prevented from being exposed.

Figure 4:
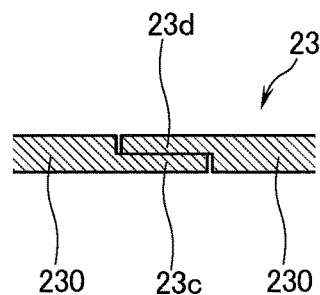
FIG. 4 is a sectional view taken along the line IV-IV in FIG. 2.

The insulating plate 23 may be integrally constituted but, as shown in FIGS. 2 and 4, the insulating plate 23 shall preferably be constituted by dividing it into a plurality (3 pieces in FIG. 2) of arcuate members 230. Each of the arcuate members 230 has, at circumferential one end, a first stepped portion 23c in which a lower part extends further than an upper part, and a second stepped portion 23d in which the upper part extends further than the lower part. The stepped surfaces (i.e., surfaces indented due to stepping machining) of the first stepped portion 23c and of the second stepped portion 23d of the adjoining arcuate members are mutually brought into contact with each other. According to this arrangement, each of the arcuate members 230 can be moved independently in the radial direction. As a result, the clearance d1 between the side surface of the target 21 and the insulating plate 23 can be adjusted substantially uniformly over the entire circumference of the target 21.

At the bottom portion of the vacuum chamber 1, there is disposed a stage 5 in a manner to lie opposite to the sputtering surface 21a of the target 21, and a substrate W is held after due positioning on the stage with the film forming surface looking upward. Although not particularly illustrated, the above-mentioned sputtering apparatus SM has a known control means equipped with microcomputer, sequencer, and the like. It is thus so arranged that the operation of the power supply E, the operation of the mass flow controller 11, the operation of the vacuum pump P, and the like can be integrally controlled.

A description will now be made of a method of manufacturing the above-mentioned target assembly 2. First, a target 21 made of aluminum oxide is bonded via a bonding material to the bonding portion 22b of the backing plate 22. As the bonding material, indium can be used. As the bonding method, a known method can be used. Then, that surface of the projected portion 22a which lies on the side of the target 21 is covered with the insulating plate 23, and the insulating plate is fixed with a screw to the backing plate 22 by means of a spacer 24 that is inserted into a through-hole 23b formed in the insulating plate 23.

The target assembly 2 manufactured as described above is assembled into the sputtering apparatus SM. At this time, by appropriately moving the three pieces of arcuate members 230, which constitute the insulating plate 23, respectively in the radial direction, the clearance S1 between the side surface of the target 21 and the insulating plate 23 can be adjusted substantially uniformly over the entire circumference of the target 21. A description will now be made of a method of forming an aluminum oxide film on the surface of the substrate W by using the sputtering apparatus SM in which the target assembly 2 has been assembled.

First, after having set in position the substrate W on the stage 5 inside the vacuum chamber 1, the evacuating means P is operated to evacuate the processing chamber 1a to a predetermined degree of vacuum (e.g., $1 \times 10^{-5}$ Pa). Once the processing chamber 1a has reached the predetermined pressure, the mass flow controller 11 is controlled to thereby introduce argon gas at a predetermined flow rate (at this time, the pressure inside the vacuum processing chamber 1a will attain a pressure range of 0.01 Pa~30 Pa). Together with these operations, AC power is applied to the target 21 from the sputtering power source E to the target 21 to thereby form plasma inside the vacuum chamber 1. According to these operations, the sputtering surface 21a of the target 21 gets sputtered, and the sputtered particles thus scattered are caused to be adhered to, and deposited on, the surface of the substrate W. Aluminum oxide film can thus be formed.

According to this embodiment, even if there is a clearance between the target 21 and the shield plate 4, electrons in the plasma are prevented from getting charged to the projected portion 22a by covering, with the insulating plate 23, that surface of the projected portion 22a of the backing plate 22 which lies on the side of the target 21. The abnormal discharging between the backing plate 22 and the target 21 can be restrained. As a result, the bonding material that bonds the target 21 and the backing plate 22 together can surely be prevented from seeping to the outside. Furthermore, since the insulating plate 23 is detachable, at the time of replacing the target 21, the insulating plate 23 can be removed from the backing plate 22 and the bonding material B can be removed. Then, the used target 21 and the backing plate 22 can be easily separated from each other. Unlike the above-mentioned prior art, it is not necessary to remove the insulator film and to form again the insulator film. Thus, the recycling of the backing plate 22 is easy.

Further, if the plate thickness t1 of the insulating plate 23 is made larger, the electrons in the plasma become difficult to pass through the clearance d1 between the side surface of the target 21 and the insulating plate 23. Although the margin of the clearance d1 can be widened, the distance d3 from the insulating plate 23 to the shield plate 4 becomes shorter, resulting in that abnormal discharging is likely to occur between the two. According to this embodiment, on the other hand, by providing the protruded strip 23a, the thickness t2 of the inner peripheral edge portion of the insulating plate 23 can be made larger without shortening the above distance d3. Therefore, while preventing the occurrence of abnormal discharging between the insulating plate 23 and the shield plate 4, the margin of the above-mentioned clearance d1 can advantageously be widened.

There are cases where fluctuations occur in the above-mentioned clearance d1 over the entire circumference of the target 21 due to fluctuations in manufacturing of the target 21, and there is a possibility of local occurrence of abnormal discharging at a portion where the clearance d1 is large. According to this embodiment, preferably, the insulating plate 23 is divided into a plurality of arcuate members 230. Each of the arcuate members 230 is provided, at circumferential one end, with a first stepped portion 23c in which a lower part extends further than an upper part, and a second stepped portion 23d in which the upper part extends further than the lower part. The first stepped portion 23c and the second stepped portion 23d of the adjoining arcuate members are mutually brought into contact with each other. According to this arrangement, each of the arcuate members 230 can be independently moved in the radial direction. Therefore, the clearance d1 between side surface of the target 21 and the insulating plate 23 can be substantially equally adjusted over an entire circumference.

Description has so far been made of an embodiment of this invention. However, this invention shall not be limited to the above. A description was made of an example in which the material of the target 21 and of the insulating plate 23 is aluminum oxide. However, without limiting to the above, other insulating materials such as magnesium oxide may also be selected appropriately. In addition, the target 21 and the insulating plate 23 may be made in materials different from each other. Still furthermore, as the insulating plate 23, aside from the one which is made only of the insulating material, there may be used those which are made by spray coating and the like in which the surface of a base material such as metal and the like is coated with a film of insulating material.

Figure 5:
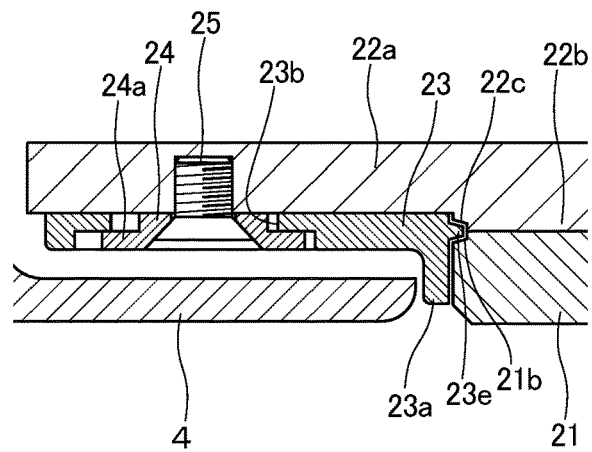
FIG. 5 is a sectional view showing in enlargement essential portion of a modified example of the target assembly.

In the above-mentioned embodiment, a description was made of a case in which the side surface of the bonded portion 22b and the side surface of the target 21 are at right angles to the projected portion 22a. However, as shown in FIG. 5, the portion formed by bonding of the target 21 and the bonding portion 22b are machined radially inward, thereby forming recessed portions 21b, 22c. A protruded portion 23e is disposed in a manner to protrude into an inner circumference of the insulating plate 23 such that a predetermined clearance is secured between the recessed portions 21b, 22c and convex portion 23e. In other words, by thus forming a labyrinth structure, to the much advantage, the electrons in the plasma become harder to reach the projected portion 22a.

Next, in order to confirm the above-mentioned effects, the following experiments were carried out by using the above-mentioned sputtering apparatus SM. In the experiment, as a substrate W a Si substrate of ϕ200 mm (in diameter) was used. As the target assembly 2 there was used one having bonded together, by means of indium B, a target 21 of aluminum oxide of ϕ300 mm (in diameter) and a backing plate 22 of copper. The projected portion 22a was covered by an insulating plate 23 of plate thickness t1 of 1.5 mm and plate thickness t2 of 2.3 mm. After having set in position the substrate W on the stage 5 inside the vacuum chamber 1, an aluminum oxide film was formed on the surface of the substrate W in a sputtering method. The film-forming conditions were: argon gas flow rate of 29 sccm (pressure inside the processing chamber 1a of 0.15 Pa); and applied power to the target 21 of 13.56 MHz, 4000 W (Vpp: 2300V). While adjusting the clearance d1 between the target 21 and the insulating plate 23 to 0.15 mm, 0.2 mm, 0.25 mm, 0.3 mm, respectively, film formation was carried out, respectively. During film formation, when Vdc's (charging potentials of the backing plate 22 due to electrons flown to the backing plate 22) were respectively measured to confirm the presence or absence of abnormal discharging, it has been confirmed that, when the clearance d1 was adjusted to below 0.2 mm, Vdc did not cause hunting, and abnormal discharging did not occur.

In addition, similar film formation as above was also carried out on the similar conditions as above except that there was used an insulating plate 23 whose plate thickness t1 was 1.5 mm and without a protruded strip 23a, thereby confirming the presence or absence of abnormal discharging during film formation. It has then been found out that, as long as the clearance d1 is adjusted to a value below 0.15 mm, Vdc was stabilized without causing hunting, and abnormal discharging did not occur.

According to the above, it has been found that the occurrence of abnormal discharging can be prevented by covering the projected portion 22a with the insulating plate 23. It has further been found that, by providing the protruded strip 23a, the margin of the clearance d1 can be widened.

EXPLANATION OF REFERENCE CHARACTERS

SM sputtering apparatus
2 target assembly
21 target made of an insulating material
22 backing plate
22a projected portion
23 insulating plate
23a protruded strip
23b through-hole
23c first stepped portion
23d second stepped portion
24 spacer
24a flange portion
230 arcuate member
4 shield plate

The invention claimed is:

1. A target assembly comprising:
a target made of an insulating material; and
a backing plate bonded to one surface of the target via a bonding material, the backing plate having a projected portion which is projected outward beyond an outer peripheral edge of the target,
wherein
the target assembly is further provided with an annular insulating plate:
which encloses a circumference of the target while maintaining a predetermined clearance to a side surface of the target;
which covers that surface of the projected portion which lies on a side of the target; and
which is detachably attached to the backing plate;
wherein an annular shield plate to enclose the circumference of the target is disposed while maintaining a predetermined clearance to the side surface of the target in a state in which the target assembly is assembled into the sputtering apparatus, and
wherein the target assembly further comprises a protruded strip which protrudes toward the target in that inner peripheral portion of the insulating plate which faces a clearance between the target and the shield plate.

2. The target assembly according to claim 1, wherein the insulating plate has a plurality of through-holes formed at a distance from one another in the circumferential direction, and is fixed to the backing plate via a spacer which is internally inserted into each of the through-holes while maintaining a clearance to an inner wall of each of the through-hole,
wherein, provided that side of the insulating plate which lies on the side of the backing plate is defined as an upper side, the spacer has formed at a lower end thereof a flange portion which extends radially outward, and an upper surface of the flange portion is brought into contact with a lower surface of the insulation plate.

3. The target assembly according to claim 2, wherein: the insulating plate is divided into a plurality of arcuate members; each of the arcuate members has, at circumferential one end, a first stepped portion in which a lower part extends further than an upper part, and a second stepped portion in which the upper part extends further than the lower part; and stepped surfaces of the first stepped portion and the second stepped portion of the adjoining arcuate members are mutually brought into contact with each other.

4. A target assembly comprising:
a target made of an insulating material; and
a backing plate bonded to one surface of the target via a bonding material, the backing plate having a projected portion which is projected outward beyond an outer peripheral edge of the target,
wherein the target assembly is further provided with an annular insulating plate:
which encloses a circumference of the target while maintaining a predetermined clearance to a side surface of the target;
which covers that surface of the projected portion which lies on a side of the target; and
which is detachably attached to the backing plate,
wherein the insulating plate has a plurality of through-holes formed at a distance from one another in the circumferential direction, and is fixed to the backing plate via a spacer which is internally inserted into each of the through-holes while maintaining a clearance to an inner wall of each of the through-hole,
wherein, provided that side of the insulating plate which lies on the side of the backing plate is defined as an upper side, the spacer has formed at a lower end thereof a flange portion which extends radially outward, and an upper surface of the flange portion is brought into contact with a lower surface of the insulation plate.

5. The target assembly according to claim 4, wherein: the insulating plate is divided into a plurality of arcuate members; each of the arcuate members has, at circumferential one end, a first stepped portion in which a lower part extends further than an upper part, and a second stepped portion in which the upper part extends further than the lower part; and stepped surfaces of the first stepped portion and the second stepped portion of the adjoining arcuate members are mutually brought into contact with each other.

* * * * *